United States Patent
Liu et al.

(10) Patent No.: US 8,359,528 B2
(45) Date of Patent: Jan. 22, 2013

(54) PARITY LOOK-AHEAD SCHEME FOR TAG CACHE MEMORY

(75) Inventors: Chi-Lin Liu, Yonghe (TW); Yi-Tzu Chen, Hsin-Chu (TW); Chung-Cheng Chou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 360 days.

(21) Appl. No.: 12/842,676

(22) Filed: Jul. 23, 2010

(65) Prior Publication Data
US 2012/0023388 A1  Jan. 26, 2012

(51) Int. Cl.
*H03M 13/00* (2006.01)
(52) U.S. Cl. .......................................................... 714/805
(58) Field of Classification Search .................... 714/48, 714/53, 54, 758, 763, 764, 766, 768, 774, 714/799–805
See application file for complete search history.

(56) References Cited

U.S. PATENT DOCUMENTS

| | | | | |
|---|---|---|---|---|
| 4,483,003 A | * | 11/1984 | Beal | 714/805 |
| 5,479,641 A | * | 12/1995 | Nadir et al. | 711/128 |
| 5,832,250 A | * | 11/1998 | Whittaker | 711/144 |
| 5,956,746 A | * | 9/1999 | Wang | 711/137 |
| 6,038,693 A | * | 3/2000 | Zhang | 714/768 |
| 6,226,763 B1 | * | 5/2001 | Fu et al. | 714/53 |
| 6,292,906 B1 | * | 9/2001 | Fu et al. | 714/6.24 |

* cited by examiner

*Primary Examiner* — Nadeem Iqbal
(74) *Attorney, Agent, or Firm* — Slater & Matsil, L.L.P.

(57) ABSTRACT

A device includes a tag cache memory array; a pre-parity unit configured to receive an address, and calculate and output a pre-parity bit calculated from all bits of the address. A comparator is configured to compare a tag read from the tag cache memory array with the address, and output a read-hit bit. The read-hit bit is true when the tag and the address are identical, and is false when the tag and the address are not identical. The device further includes a simplified parity-check unit configured to receive and perform operations on the pre-parity bit, the read-hit bit, and a parity bit from the tag cache memory array, and to output a read-parity bit.

18 Claims, 4 Drawing Sheets

| Input / Internal Signals | | | Output Signals | |
|---|---|---|---|---|
| Valid Bit | phy_addr~^tag (Comparator) | | rd_hit Bit | rd_parity Bit |
| 1 | 1 (phy_addr and tag are identical) | | 1 | Pre-parity*^ parity |
| 1 | 0 (at least one bit of phy_addr and tag are different) | | 0 | 0 |
| 0 | X | | 0 | 0 |

Fig. 3

PARITY LOOK-AHEAD SCHEME FOR TAG CACHE MEMORY

TECHNICAL FIELD

This disclosure relates generally to integrated circuits, and more particular to the parity look-ahead scheme for the parity check of tag cache memories.

BACKGROUND

Cache memory is a component that is used to improve performance by storing data so that future requests for that data can be served faster. The data that is stored within a cache memory might be values that have been computed earlier or duplicates of original values that are stored elsewhere. If requested data are contained in the cache (referred to as a cache hit), the request can be served by simply reading from the cache memory, which is comparably faster. Otherwise, if the requested data is not contained in the cache (referred to as a cache miss), the data has to be recomputed or fetched from its original storage location such as the main memory, which is comparably slower. Hence, the more requests can be served from the cache, the better the overall system performance is.

To ensure the correctness of the cache access, the cache address need to be verified to ensure it is not corrupted. A cache memory includes a data cache memory and a tag cache memory, wherein the addresses of the cached data saved in the data cache memory are saved in the tag cache memory, which stores addresses. Accordingly, when a request for accessing the cached data is made, the address in the request will be verified by comparing the address with the data (referred to as a tag) saved in the tag cache memory. FIG. 1 illustrates a block diagram of a conventional circuit for the verification of the tag. Tag cache memory array 100 stores tags, which are the addresses of the cached data. For each of the tags, for example, tag tag[23:0], a parity bit of tag tag[23:0] is also saved. In the tag verification, the address denoted as phy_address, which address may be used in a central processing unit (CPU) instruction, is provided. Comparator 102 compares address phy_address and tag tag[23:0] bit-by-bit to generate a read-hit (rd_hit) bit. If address phy_address is identical to tag tag[23:0], the rd_hit bit is true. Otherwise, it is false.

The rd_hit bit is provided to parity-check unit 104 to generate a read-parity (rd_parity) bit, which indicates whether the parities of the tag tag[23:0] and the address phy_address are the same as the parity of tag tag[23:0] when it is saved. The rd_parity bit may be calculated as tag[23] ^ tag[22] ^ . . . tag[1] ^ tag[0] ^ parity, wherein values tag[0] through tag[23] are the bits of tag tag[23:0], and the bit "parity" is the parity bit of tag tag[23:0], which parity bit is read from tag cache memory array 100. The symbol "^" represents an exclusive-OR operator. Parity-check unit 104 also receives a valid bit from tag cache memory array 100, wherein the valid bit indicates whether tags are valid or not, and if valid bit is true, the generated rd_hit bit and rd_parity bit are outputted. Otherwise, rd_parity bit is set to false.

The time for the tag verification is critical to the performance of the cache memory. It was estimated that reading tag tag[23:0], the parity bit, and the valid bit from tag cache memory array 100 may take up to 300 pico-seconds (ps). Parity-check unit 104 may take up to 200 ps to process tag tag[23:0], the valid bit, the rd_hit bit, and the parity bit. Comparator 102 may take up to 125 ps to generate rd_hit bit, and the "AND" operation of the rd_hit bit and the parity bit may take 20 ps. Accordingly, the total time for the tag verification takes 300+200+20=520 ps. The 125 ps used by comparator 102 is not considered since it is in the same time frame used by parity-check unit 104 (200 ps).

SUMMARY

In accordance with one aspect, a device includes a tag cache memory array; a pre-parity unit configured to receive an address, and calculate and output a pre-parity bit calculated from all bits of the address. A comparator is configured to compare a tag read from the tag cache memory array with the address, and output a read-hit bit. The read-hit bit is true when the tag and the address are identical, and is false when the tag and the address are not identical. The device further includes a simplified parity-check unit configured to receive and perform operations on the pre-parity bit, the read-hit bit, and a parity bit from the tag cache memory array, and to output a read-parity bit.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIG. 3 illustrates a table showing values of inputs and outputs of a simplified parity-check unit.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel tag verification circuit for verifying tags in a tag cache memory is provided. The variations and the operation of the embodiments are discussed. Throughout the various views and illustrative embodiments, like reference numbers are used to designate like elements.

Figure 1:
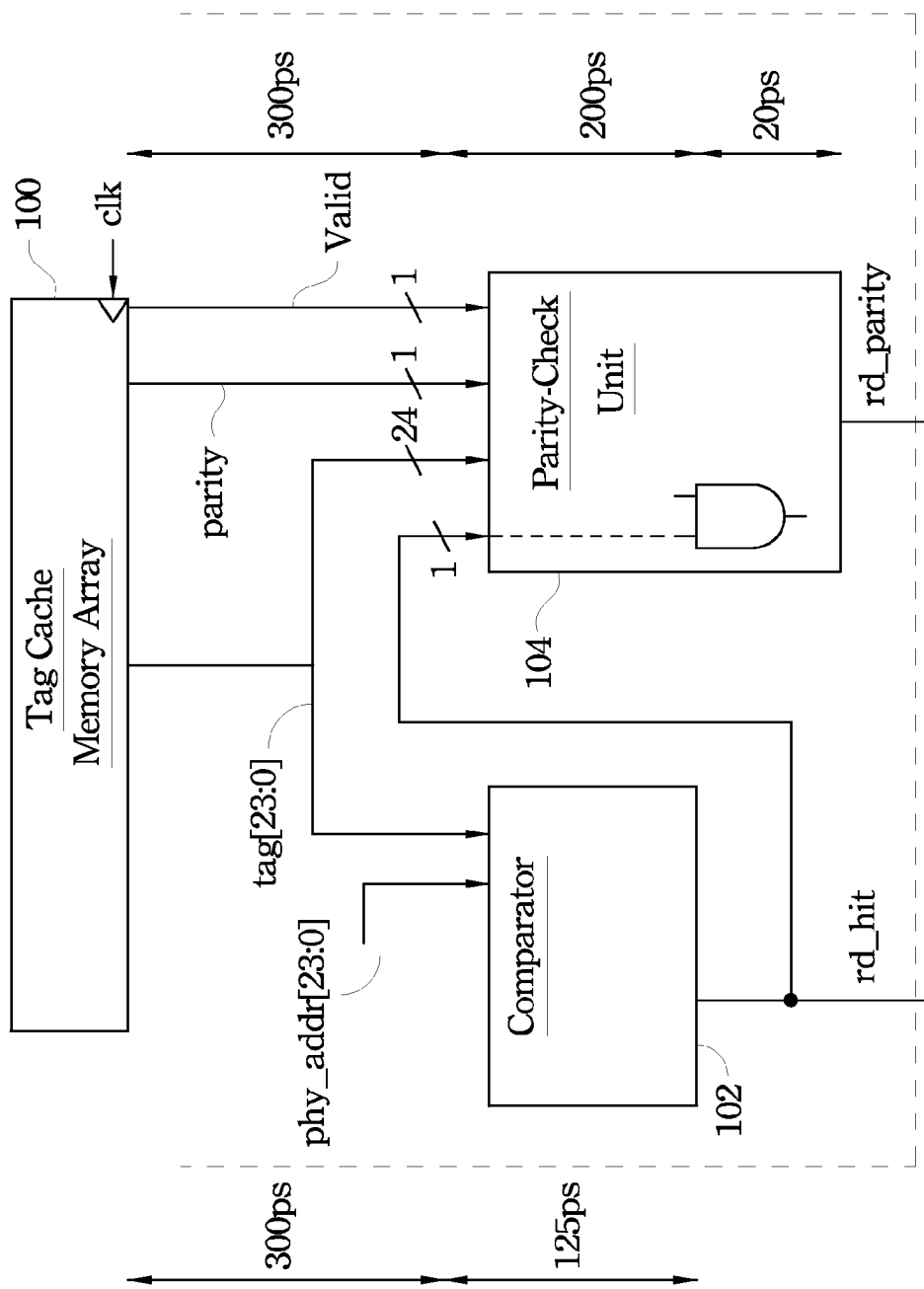
FIG. 1 illustrates a block diagram of a conventional circuit for tag verification.
Figure 2:
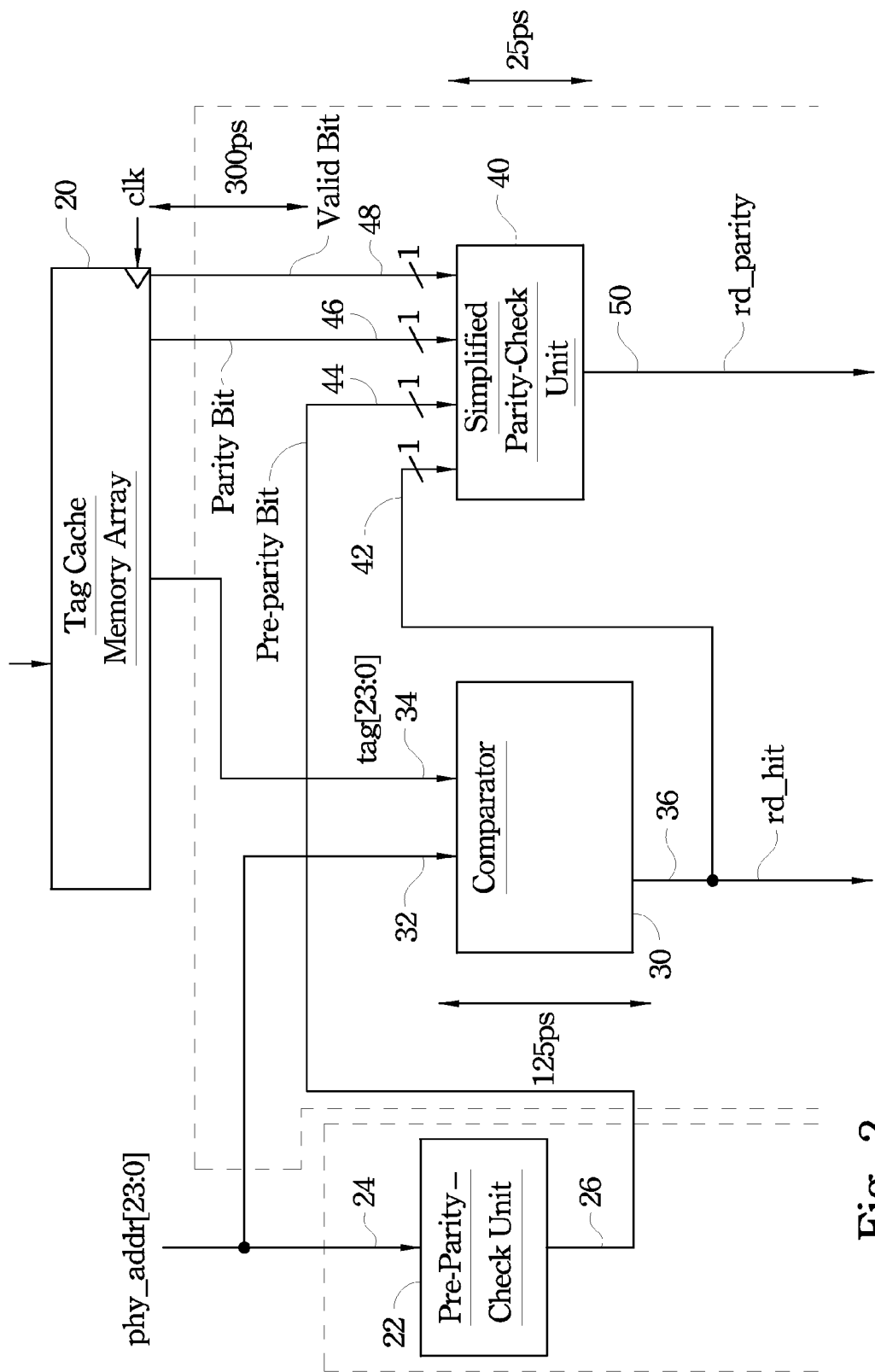
FIG. 2 illustrates a block diagram of a tag verification circuit in accordance with an embodiment.

FIG. 2 illustrates a block diagram of a tag verification circuit in accordance with an embodiment. Tag cache memory array 20 stores tags, which are the addresses of the cached data. Throughout the description, a tag is expressed as tag[23:0], indicating that it has 24 bits ranging from bit 0 to bit 23. In alternative embodiments, tags may have different numbers of bits such as 32 bits. In an exemplary tag verification process, address phy_addr[23:0] is provided. Address phy_addr[23:0] may be an address used in an instruction of a central processing unit (CPU). A pre-parity check is performed on address phy_addr[23:0] by pre-parity check unit 22, which includes input 24 for receiving address phy_addr[23:0], and output 26 for outputting a pre-parity bit. Pre-parity check unit 22 may perform an exclusive-OR on all bits of address phy_addr[23:0]. The calculation of the pre-parity bit may be expressed as phy_addr[23] ^ phy_addr[22] ^ ... phy_addr[1] ^ phy_addr[0], wherein symbol "^" is an exclusive-OR operator.

For the tag verification, tag tag[23:0], a parity bit, and a valid bit are read from tag cache memory array 20, which read operation is triggered by an edge of clock clk. The pre-parity check is performed without waiting for the clock edge, and is performed before the read operation is finished. The pre-parity check is also finished before the read operation finishes, and enough setup time is left for each of comparator 30 and simplified parity-check unit 40.

Comparator 30 includes input 32 for receiving address phy_addr[23:0], and input 34 for receiving tag tag[23:0], which is read from tag cache memory array 20. Comparator 30 then compares address phy_addr[23:0] with tag tag[23:0] bit-by-bit, and outputs a read-hit (rd_hit) bit, which is 1 (true) if address phy_addr[23:0] and tag tag[23:0] are identical, and is 0 (false) if they are not identical.

Simplified parity-check unit 40 includes input 42 for receiving the rd_hit bit, input 44 for receiving the pre-parity bit outputted by pre-parity check unit 22, and inputs 46 and 48 for receiving the parity bit and the valid bit, respectively, which are read from tag cache memory array 20. Simplified parity-check unit 40 also has output 50 for outputting a read-parity (rd_parity) bit. The input and output values of simplified parity-check unit 40 are illustrated in FIG. 3. It is noted that if the valid bit is 0, the resulting rd_hit bit and rd_parity bit may both be set to 0 to indicate that the value in tag tag[23:0] is invalid. If valid bit is 1, and the rd_hit bit is 0, indicating that address phy_addr[23:0] and tag tag[23:0] are not identical, the resulting rd_parity bit will always be set to 0. If valid bit is 1, and the rd_hit is 1, indicating that phy_addr[23:0] and tag tag[23:0] are identical, then the outputted rd_parity bit is set to the exclusive-OR of the pre-parity bit and the parity bit (pre-parity ^ parity).

Whether the result of the "pre-parity^parity" is 0 or 1 may depend on whether the respective parity check is an even parity check or an odd parity check. For example, if the parity check is an even parity-check, then the value 0 of "pre-parity ^ parity" indicates the parity check result is correct, and the "pre-parity^parity" of 1 indicates the parity check result is wrong. If the parity check is an odd parity-check, then the "pre-parity ^ parity" of 1 may indicate the parity check result is correct, and the value 0 of "pre-parity ^ parity" indicates the parity check result is wrong. In other words, the design could be implemented on any parity-check. Regardless, the purpose of checking the "pre-parity ^ parity" is to determine whether the parities of tag tag[23:0] and address phy_addr are the same as the parity of tag tag[23:0], which parity was written into the tag cache memory array when tag tag[23:0] was saved.

In an exemplary embodiment, the time required for the tag verification may be estimated as follows. The pre-parity may take up to 200 ps. However, because the pre-parity is performed at the same time tag cache memory array 20 is accessed to read tag tag[23:0], the parity bit, and the valid, and further because the read operation may take up to about 300 ps, the time required by pre-parity check unit 22 is not counted. Comparator 30 may take up to 125 ps to generate the rd_hit bit. The simplified parity-check may take about 25 ps. Accordingly, the total time for the tag verification takes 300+125+25=450 ps. This is less than the time required in the conventional tag verification scheme, which may take about 520 ps.

Figure 4:
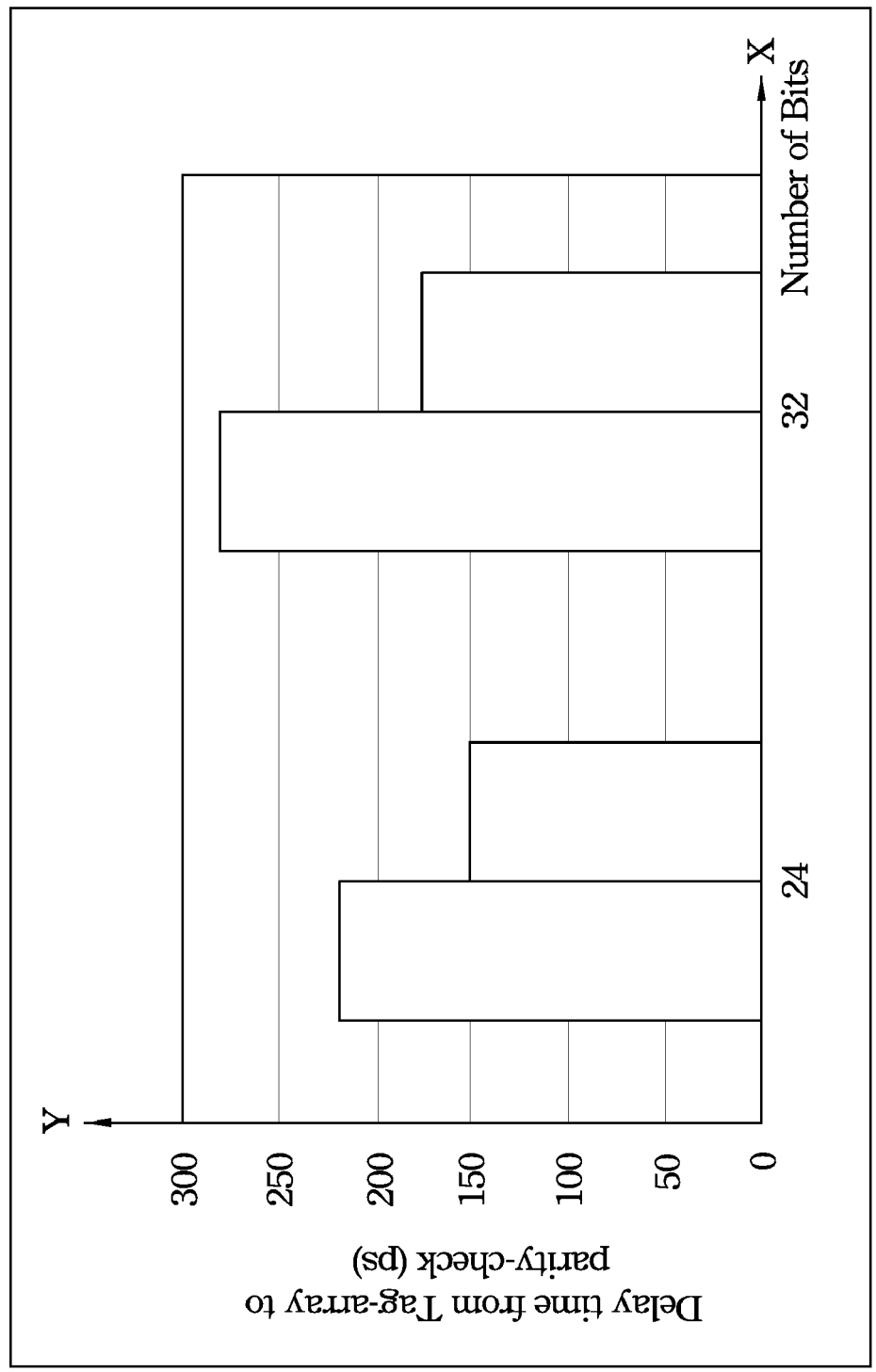
FIG. 4 illustrates a comparison of time used for tag verification in different schemes.

FIG. 4 illustrates the simulation results illustrating a comparison between the time of tag verification required by the embodiment and the time required in conventional schemes. The X axis indicates the total number of bits of the tags, and the Y axis indicates the time required for the tag verification, wherein the time is counted starting from the time the reading operation (from the respective tag cache memories) is finished. It is observed that if the tags have 24 bits, the tag verification time may be reduced by about (100−68.2) percent, which is about 31.8 percent. If the number of bits in tags increases, the reduction in the tag verification time is more significant. For example, if the tags have 32 bits, the tag verification time may be reduced by about (100−62.5) percent, which is about 37.5 percent.

In the embodiments, by performing the pre-parity parallel with the reading from tag cache memory, the tag verification time is reduced. Further, since the pre-parity check takes much less time than the reading of the tag cache memory, there is still enough setup time for each of comparator 30 and simplified parity-check unit 40, and hence there is no need to increase the setup time for comparator 30 and simplified parity-check unit 40.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a tag cache memory array;
    a pre-parity unit configured to receive an address, and calculate and output a pre-parity bit calculated from all bits of the address;
    a comparator configured to compare a tag read from the tag cache memory array with the address, and output a read-hit bit, wherein the read-hit bit is true when the tag and the address are identical, and is false when the tag and the address are not identical; and
    a simplified parity-check unit configured to receive and perform operations on the pre-parity bit, the read-hit bit, and a parity bit from the tag cache memory array, and to output a read-parity bit.

2. The device of claim 1, wherein the simplified parity-check unit is further configured to receive a valid bit from the tag cache memory array, and output the read-parity bit as false when the valid bit is false.

3. The device of claim 2, wherein the simplified parity-check unit is configured to output the read-parity bit as an exclusive-OR of the pre-parity bit and the parity bit when the valid bit and the read-hit bit are true.

4. The device of claim 1, wherein the pre-parity unit is configured to calculate the pre-parity bit before the simplified parity-check unit and the comparator finishes receiving a valid bit, the tag, and the parity bit from the tag cache memory array.

5. The device of claim 1, wherein the pre-parity unit is configured not to receive the tag.

6. The device of claim 5, wherein the simplified parity-check unit is configured not to receive the tag.

7. The device of claim 5, wherein the pre-parity bit equals the exclusive-OR of all bits of the address.

8. A device comprising:
  a tag cache memory array comprising:
    a first output configured to output a tag;
    a second output configured to output a parity bit, wherein the parity bit represents a stored parity of the tag; and
    a third output configured to output a valid bit representing a valid state of the tag;
  a pre-parity unit comprising an input and an output, wherein the input is not coupled to any of the first, the second, and the third outputs of the tag cache memory array;
  a comparator comprising:
    a first input coupled to the first output of the tag cache memory array;
    a second input coupled to receive a same address as the input of the pre-parity unit; and
    an output; and
  a simplified parity-check unit comprising:
    a first input coupled to the output of the pre-parity unit;
    a second input coupled to the second output of the tag cache memory array;
    a third input configured to the third output of the tag cache memory array; and
    an output.

9. The device of claim 8, wherein the simplified parity-check unit further comprises a fourth input coupled to the output of the comparator.

10. The device of claim 9, wherein the simplified parity-check unit is configured to output an exclusive-OR of the parity bit and a pre-parity bit from the output of the pre-parity unit to the output of the simplified parity-check unit when the valid bit and a read-hit bit received from the fourth input are true.

11. The device of claim 8, wherein the comparator is configured to compare the tag read from the first input of the comparator with an address read from the second input of the comparator to generate a read-hit bit, and outputs the read-hit bit to the output of the comparator.

12. The device of claim 11, wherein the pre-parity unit is configured to calculate a pre-parity bit of an address received from the input of the pre-parity unit, wherein the pre-parity bit equals the exclusive-OR of all bits of the address.

13. The device of claim 8, wherein the simplified parity-check unit is configured to output a false when the valid bit is false.

14. A method comprising:
  receiving an address;
  performing a pre-parity check on the address to generate a pre-parity bit;
  reading a tag and a parity bit from a tag cache memory array, wherein the step of performing the pre-parity check is performed before the step of reading finishes;
  comparing the address and the tag to generate a read-hit bit, wherein the read-hit bit is true with the address and the tag are identical, and is false when the address and the tag are not identical; and
  performing an operation on the pre-parity bit, the parity bit, and the read-hit bit to generate a read-parity bit.

15. The method of claim 14, wherein the step of performing the pre-parity check finishes at a first time before the step of reading the tag and the parity bit from the tag cache memory array finishes at a second time.

16. The method of claim 15, wherein a difference between the first time and the second time is greater than a first setup time for the step of comparing and a second setup time for the step of performing the operation.

17. The method of claim 14 further comprising reading a valid bit from the tag cache memory array, wherein the read-parity bit is equal to an exclusive-OR of the parity bit and the pre-parity bit when the valid bit is true, and the read-parity bit is false when the valid bit is false.

18. The method of claim 17, wherein the read-parity bit is equal to an exclusive-OR of the parity bit and the pre-parity bit when the valid bit and the read-hit bit are both true, and the read-parity bit is false when one or both of the valid bit and the read-hit bit is false.

* * * * *